(12) United States Patent
Voldman

(10) Patent No.: US 7,732,293 B2
(45) Date of Patent: *Jun. 8, 2010

(54) TUNABLE SEMICONDUCTOR DIODES

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 22 days.

This patent is subject to a terminal disclaimer.

(21) Appl. No.: 12/185,140

(22) Filed: Aug. 4, 2008

(65) Prior Publication Data

US 2008/0311723 A1    Dec. 18, 2008

Related U.S. Application Data

(60) Continuation of application No. 11/469,582, filed on Sep. 1, 2006, now Pat. No. 7,439,145, which is a division of application No. 10/707,722, filed on Jan. 7, 2004, now Pat. No. 7,119,401.

(51) Int. Cl.
   *H01L 21/8222* (2006.01)
(52) U.S. Cl. .................. 438/332; 438/379; 438/383; 257/E21.352
(58) Field of Classification Search ............ 438/332, 438/379, 383; 257/E21.352
   See application file for complete search history.

(56) References Cited

U.S. PATENT DOCUMENTS 5,223,737 A    6/1993    Canclini
5,426,320 A    6/1995    Zambrano
5,708,289 A    1/1998    Blanchard
6,093,620 A *  7/2000    Peltzer ................. 438/416
6,507,080 B2   1/2003    Jang et al.
2003/0047750 A1  3/2003  Russ et al.
2004/0169233 A1* 9/2004  Yamamoto et al. ........ 257/361

OTHER PUBLICATIONS

Notice of Allowance (mail date Jun. 6, 2008) for U.S. Appl. No. 11/469,582, filed Sep. 1, 2006; First Named Inventor Steven H. Voldman; Customer No. 30449.
Notice of Allowance (mail date Aug. 1, 2006) for U.S. Appl. No. 10/707,722, filed Jan. 7, 2004; First Named Inventor Steven H. Voldman; Customer No. 30449.

* cited by examiner

*Primary Examiner*—Tuan N. Quach
(74) *Attorney, Agent, or Firm*—Schmeiser, Olsen & Watts; Anthony J. Canale

(57) ABSTRACT

A diode structure fabrication method. In a P− substrate, an N+ layer is implanted. The N+ layer has an opening whose size affects the breakdown voltage of the diode structure. Upon the N+ layer, an N− layer is formed. Then, a P+ region is formed to serve as an anode of the diode structure. An N+ region can be formed on the surface of the substrate to serve as a cathode of the diode structure. By changing the size of the opening in the N+ layer during fabrication, the breakdown voltage of the diode structure can be changed (tuned) to a desired value.

11 Claims, 6 Drawing Sheets

TUNABLE SEMICONDUCTOR DIODES

This application is a continuation application claiming priority to Ser. No. 11/469,582, filed Sep. 1, 2006 and issued on Oct. 21, 2008 as U.S. Pat. No. 7,439,145, which is a divisional of Ser. No. 10/707,722, filed Jan. 7, 2004 and issued on Oct. 10, 2006 as U.S. Pat. No. 7,119,401.

BACKGROUND OF THE INVENTION

1. Technical Field

The present invention relates to semiconductor diodes, and more particularly, to tunable semiconductor diodes.

2. Related Art

ESD (electrostatic discharges) diodes are well known in present day semiconductor technology in order to protect I/O and other internal circuitry from electrostatic discharges and other overvoltage conditions that could cause catastrophic failure in integrated circuits. See e.g. U.S. Pat. No. 5,629,544 to Voldman et al., "Semiconductor Diode with Silicide Films and Trench Isolation," which teaches ESD diodes having silicided electrodes to reduce series resistance, and U.S. Pat. No. 5,945,713 to Voldman, "Electrostatic Discharge Protection Circuits for Mixed Voltage Interface and Multi-Rail Disconnected Power Grid Applications," which teaches an ESD diode that can interface with multiple supply voltages.

Because of high sheet resistance, these ESD diodes must be made large in order to discharge the ESD currents. Voldman et al using a p+/n well diode showed that ESD improvement can be achieved by reduction of the n well sheet resistance in a CMOS technology from 1000 Ohms/square to 300 Ohms/square. In a CMOS technology, this also leads to an increase in the capacitance per unit area which is acceptable for CMOS technologies below 1 GHz application frequencies but not for application speeds above this frequency range. Large ESD structures are also unacceptable for high speed RF (Radio Frequency) applications due to the high capacitance load placed on the RF circuit.

As integrated circuit (IC) switching speeds approach and pass 1 GHz, there is a need to reduce the capacitance of ESD diodes. This is because as switching speeds increase, device area decreases, such that device reactance remains relatively constant. As capacitance decreases, it is desirable to avoid compromising the ESD robustness (that is, the breakdown voltage) of the diode. In general, these goals have been mutually exclusive; ESD robustness is typically preserved by making the diode structure fairly large, which drives up capacitance. Thus, there is a need in the art for an ESD diode that has reduced capacitance without reduced ESD robustness.

SUMMARY OF THE INVENTION

The present invention provides a method for forming a diode structure, the method comprising the steps of (a) providing a substrate comprising a semiconductor material and first doping impurities with a first charge polarity; (b) implanting in the substrate second doping impurities with a second charge polarity to form a first layer with an opening, the opening comprising the semiconductor material and not comprising the second doping impurities; (c) implanting in the substrate third doping impurities with the second charge polarity to form a second layer on top of and in direct physical contact with the first layer, the first layer having a higher doping concentration than the second layer; and (d) forming an electrode structure on top of and in direct physical contact with the second layer, the electrode structure including at least an anode and a cathode.

DETAILED DESCRIPTION OF THE INVENTION

Figure 1A:
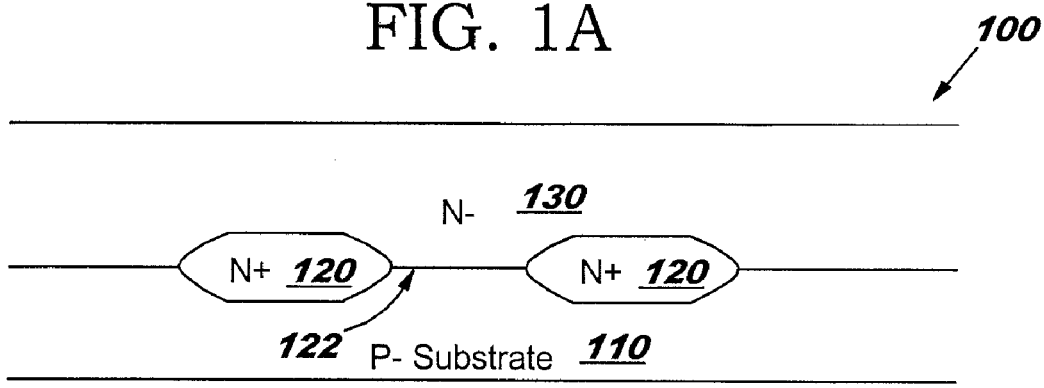
FIG. 1A-1C illustrate the steps for fabricating a diode, in accordance with embodiments of the present invention.

Diodes with different breakdown voltages and different capacitance loading are used in ICs (Integrated Circuits) for a variety of purposes. Diodes are used as analog circuit elements, varactors, and electrostatic discharge (ESD) circuit applications. Breakdown voltage values and loading capacitance are a concern for circuits on input pads. One purpose of using diodes is for usage as electrostatic discharge circuitry. ESD devices are used on input pins and between power rails to discharge current to the power rails, or between power rails. ESD may occur when isolated circuits with different functions coexist on the same IC. Electrostatic charge may accumulate on these isolated circuits, and needs to be discharged. Diodes can be used to connect these isolated circuits. For instance, a diode can be used to connect an electric node A belonging to a first circuit of the IC to another electric node B belonging to a second circuit of the same IC. When electrostatic charge is accumulated in these first and second circuits to some predetermined level such that $V_{AB}$ (voltage difference between nodes A and B) exceeds the breakdown voltage of the diode, discharge through the diode occurs. ESD devices provide low impedance paths to provide current flow between electrical nodes in a semiconductor ESD diodes influence the radio frequency (RF) response of peripheral or input-output circuitry. The RF response is critical to the circuit function. ESD diode elements provide capacitive, inductive and resistive loading effects on circuits which can lead to a shift in the frequency response of a network. For example, an LC network is influenced by the loading effect of the ESD element. Hence the ability to co-optimize and tune a network with an ESD element is critical for semiconductor design. Hence it is desirable to have a diode structure which allows a change in its capacitance-voltage relationship (e.g. C(V)) for RF circuit optimization. Therefore a structure that allows for the tuning and variation of the capacitance-voltage relationship is key for RF applications.

Linearity is an important aspect of RF circuit functionality. Linearity is the dependence on the capacitance dependence on voltage as stated in the aforementioned text. Two variables of interest are the total capacitance of the load, as well as the derivative of the capacitance with respect to voltage (e.g., dC(V)/dV) and its successive derivatives. Hence it is desirable to provide a structure and methodology to provide a structure which allows a desired C(V), and a desirable dC/dV value for circuit applications.

In RF circuit design, the ability to co-design the RF circuit function with the ESD protection elements is key to good RF design in order to provide ESD protection, and RF functionality. Hence it is desirable to have a method of design which allows optimization of ESD protection, loading effects, linearity characteristics and other RF performance objectives.

Therefore, a design of a novel diode whose capacitance loading and breakdown voltages can be tuned (varied) during the design phase or manufacturing is needed. A method is also needed for forming and operating the novel diode in ICs.

CMOS latchup, and minority parasitic devices are also important in formation of diode structures. Hence it is also important to provide the ability to lower the injection of minority carriers, and provide good linearity of diode structures.

The diode structure also forms a vertical pnp transistor in the semiconductor chip. Modulation and optimization of the diode characteristics as well as the vertical pnp characteristics is desirable from a capacitance loading, ESD, noise and RF performance perspective.

As integrated circuit (IC) switching speeds improve, it is also important to provide ESD diodes with high Quality factors, known as "Q". The Q factor in an ESD diode is a function of the capacitance and the diode series resistance. For ESD robustness and a high Q factor, it is important to provide an ESD element which has a minimum of diode resistance and inductance.

As circuits increase in switching speed, it is important that the reactance remains a constant. The reactance is equal to the product of the application frequency and capacitance. Hence, there is a need in the art for an ESD diode that can be scaled to lower capacitance as the frequency of the application increases from 1 Ghz to 1000 Ghz.

For RF and high speed applications, it is also important that ESD networks do not generate noise. Noise injected into the substrate can affect analog and RF circuitry. Noise generation which occurs in the ESD network can lead to functional misoperation of analog and RF circuits. Hence, there is a need in the art for an ESD networks that prevent noise injection into adjacent analog or RF circuitry.

For RF and high speed applications, high resistive substrates are used to avoid noise coupling between digital and analog circuitry. Using low doped substrates leads to an increase in the latchup sensitivity of a technology. Latchup occurs when a negative resistance condition is established leading to a low voltage high current state. Latchup can be destructive to a semiconductor chip. Latchup typically occurs because of triggering of a pnpn structure. Current injection from overshoot or undershoot phenomenon can lead to triggering latchup. Hence, there is a need in the art for an ESD element that does not enhance the latchup sensitivity of a technology.

For analog, RF and power applications, thermal properties of a semiconductor device, isolation structure and its geometrical design can significantly influence the ESD robustness of an ESD structure. Self heating occurs in semiconductors as a result of the power in the structure. The temperature in an ESD device can be estimated as equal to the product of the power and the thermal impedance. The thermal impedance is analog of the electrical impedance which is a function of the thermal conductivity to the substrate, cross sectional area and distance to the substrate region. Hence, there is a need in the art for an ESD structures to provide an ESD device which achieves low thermal impedance to minimize self-heating and failure of an ESD structure.

The present invention provides a novel structure comprising of a region which allows for optimization of the capacitance—voltage dependence (e.g. C(V)) characteristic in a diodic structure using a masked implant in a diode structure.

The present invention provides a structure comprising of a region which allows for optimization of the derivative of the capacitance—voltage dependence (e.g. dC(V)/dV) and subsequent higher order derivatives in a diodic structure using a masked implant in a diode structure.

The present invention provides a structure comprising of a region which allows for co-optimization of the RF characteristics and the ESD performance in an integrated chip design.

The present invention provides a structure comprising of a region which allows for optimization of the diode dependence (e.g. C(V)) characteristic in a diodic structure using a masked sub-collector implant in a diode structure in a CMOS and RF CMOS technology.

The present invention provides a structure comprising of a region which allows for optimization of the diode dependence (e.g. C(V)) characteristic in a diodic structure using a masked sub-collector implant in a diode structure in a RF BiCMOS technology, such as Silicon Germanium and Silicon Germanium Carbon technology.

The present invention provides structures for a novel diode whose capacitance and breakdown voltage is tune-able in the layout process, design process and manufacturing process.

The present invention provides a method for forming and operating the novel diode whose capacitance and breakdown voltage is tune-able in the layout process, design process and manufacturing process. It is the motivation of the inventor to provide a variable tunable diode structure and method.

It is the motivation of the inventor to provide a diode structure whose capacitance-voltage relationship is variable.

It is the motivation of the inventor to provide a diode structure whose derivatives of the capacitance-voltage relationship is variable.

It is the motivation of the inventor to provide a diode structure whose breakdown voltage—capacitance relationship is variable.

It is the motivation of the present inventor to provide a diode structure in a Silicon CMOS technology, RF CMOS technology, a Silicon Germanium technology, and a Silicon Germanium Carbon technology.

It is the motivation of the present inventor to provide a method of design to allow tunable structures in a parameterized cell (P-cell) environment for co-synthesis of ESD protection and RF design.

Figure 1B:
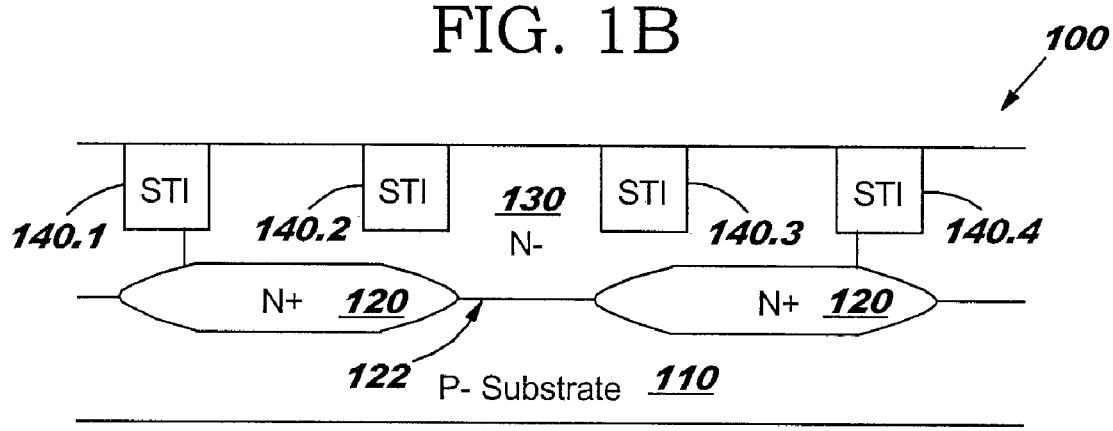
Figure 1C:
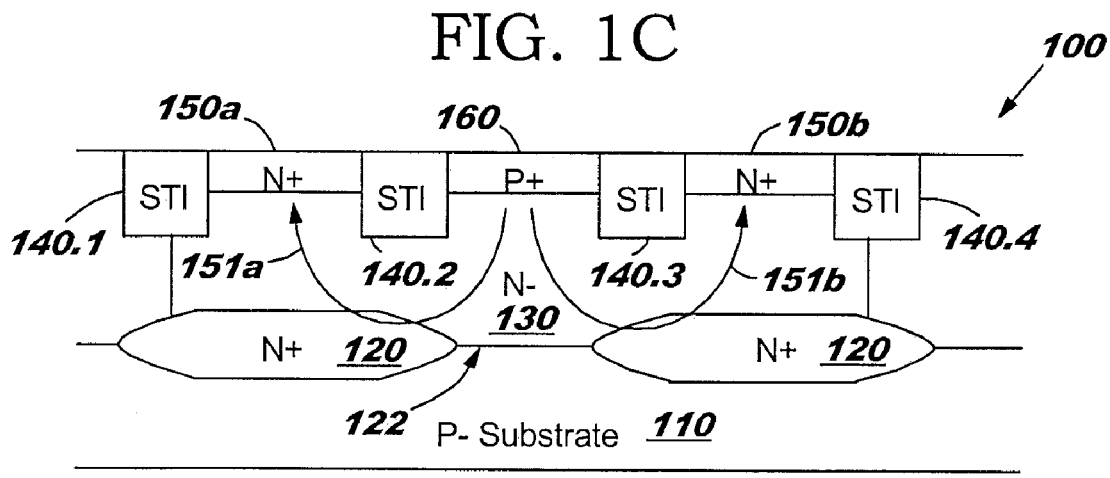

FIG. 1A-1C illustrate the steps for fabricating a diode 100, in accordance with embodiments of the present invention. More specifically, with reference to FIG. 1A, the fabrication process starts with a P− substrate 110. Then, with the use of a mask (not shown), N+ retrograde well implant region 120 with an opening (hole) 122 is implanted into the substrate 110. The size of the mask decides the size of the opening 122 in the region 120. Then, an N-region 130 is implanted into the substrate 110.

In one embodiment, alternatively, the N+ implant region 120 can be a sub-collector region. In this case, the p− substrate 110 is formed followed by the sub-collector formation. More specifically, the masked sub-collector region (not shown) is formed using a mask opening. An N− epitaxial region (not shown) can be formed over the sub-collector region. Additionally, low doped n− implants can be added into the N− epitaxial region.

With reference to FIG. 1B, STI (Shallow Trench Isolation) regions 140.1, 140.2, 140.3, and 140.4 are formed in the substrate 110. In one embodiments, the STI regions 140.1, 140.2, 140.3, and 140.4 can be formed by first creating four troughs at the four places where the STI regions 140.1, 140.2, 140.3, and 140.4 are to be formed. A dielectric material such as Silicon dioxide is formed in the STI trough region. Finally, the surface is polished to the original planar surface.

With reference to FIG. 1C, N+ regions 150a and 150b and P+ region 160 are implanted using standard processes so as to form the electrode structure of the diode 100. The p+ region 160 is typically p-channel source/drain implants used for formation of MOSFET transistors in a CMOS process. The n+ regions 150a and 150b are typically n-channel source/drain implants used for formation of MOSFET transistors in a CMOS process. More specifically, the N+ regions 150a and 150b serve as the cathodes of the diode 100, and the P+ region 160 serves as the anode of the diode 100. In this structure, there is also a vertical pnp transistor formed wherein the p+ region 160 is the emitter, the n− region 130 is the base, and the P-substrate region 110 serves as the collector region.

When the diode 100 is in forward bias mode, portions of the current flow from the anode 160 to the cathodes 150a and 150b via the N− region 130 and N+ region 120 as shown by two arrows 151a and 151b, respectively. The larger the opening 122, the higher the breakdown voltage of the diode 100. This in turn provides a lower capacitance as well as a different C(V) dependence, as well as subsequent derivatives of the C(V) characteristic. In other words, the breakdown voltage and capacitance of the diode 100 can be tuned during fabrication process by choosing the size of the opening 122 (i.e., choosing the size of the mask). Additionally, the current also flows from the p+ emitter region 160 to the substrate region 110. Hence, the opening of the mask hole 122 modulates the flow of currents both to the n+ region 120 and to the chip substrate 110.

Figure 2A:
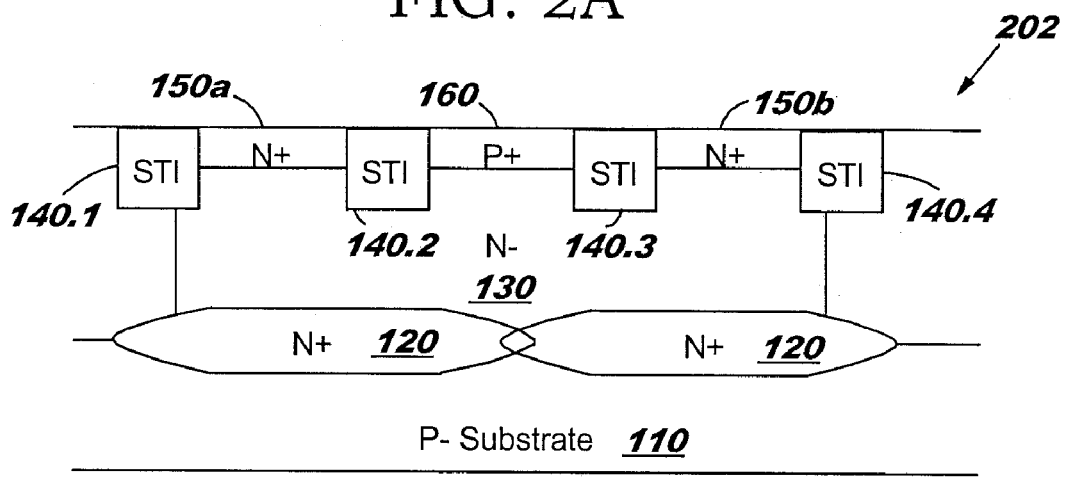
FIGS. 2A, 2B, 2C, and 2D illustrate variations of the diode of FIG. 1C, in accordance with embodiments of the present invention.

FIG. 2A illustrates a diode 202, which is a variation of the diode 100 of FIG. 1C, in accordance with embodiments of the present invention. The fabrication process is the same as that described above related to FIGS. 1A-1C, except that at some point of the fabrication process, temperature is raised so that the N+ region 120 expands and fills the opening 122. This also reduces the breakdown voltage of the diode 100. In this embodiment, the doped regions of the heavily doped regions 120 converge when the spacing 122 is small. In this case, the doping concentration is still variable in this region where the center point has the lowest doping concentration. This forms a non-uniform lower region which can be regarded as continuous doped film with a variable lateral doping concentration. In this fashion, the tuning of the C(V) dependence is achievable. By convergence of the heavily doped regions 120, the injection into the substrate 110 is lessened, but still providing tenability of the diodic characteristic. In this structure, there can be a plurality of p+ shapes along the surface. The p+ anodes can be interdigitated between the n+ cathodes. A plurality of mask openings can be placed under the p+ anodes where each opening can be equal or different in the physical size. The plurality of p+ regions also can be established without the n+ cathodes interdigitated. At the edges of the diode structure 202, the n− region transitions to a p-doped region via either a p− substrate or p− epitaxial region, or a p-well edge.

Figure 2B:
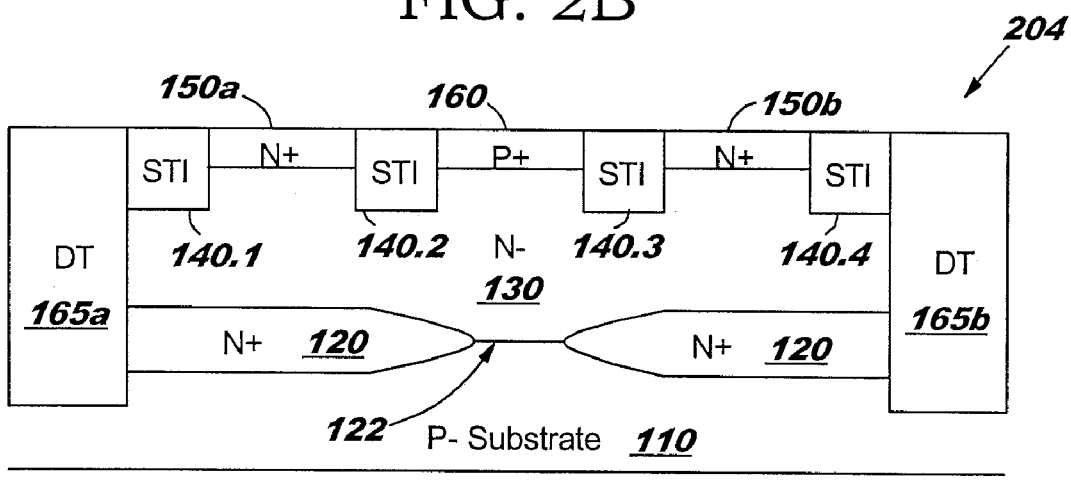

FIG. 2B illustrates a diode 204, which is another variation of the diode 100 of FIG. 1C, in accordance with embodiments of the present invention. Here, a deep trench (DT) 165a and 165b are formed in the substrate 110 to electrically isolate the diode 204. As a result, lateral currents between the diode 100 and adjacent devices (not shown) in the substrate 110 are minimized. With the addition of a deep trench structure 165, lateral injection can be isolated. In this embodiment, the trench structure 165 borders the heavily doped n+ implant 120. Deep trench structures serve to define the edge of the n+ implant region 120.

In one embodiment, the deep trenches 165a and 165b can be formed in the substrate 110 by creating two troughs where the deep trenches 165a and 165b are to be formed. Typically, the deep trench structure 165 is formed at the beginning of the process. In an implanted n-well or implanted sub-collector process, it can be the first step of process. In the case of a p− substrate and a sub-collector process formed under an n− epitaxial region, it will be formed after the formation of the sub-collector region and the aforementioned masking process. Note that this trench structure 165 is either two-dimensional edges, or form a three-dimensional ring isolating the n− region 130 from the outside edge of the DT structure. Then oxide films (not shown) can be deposited inside the two troughs. After that, the two troughs can be filled with polysilicon. Finally, the surface is planarized to the original surface. Then, the rest of the diode 204 is formed as described above.

Figure 2C:
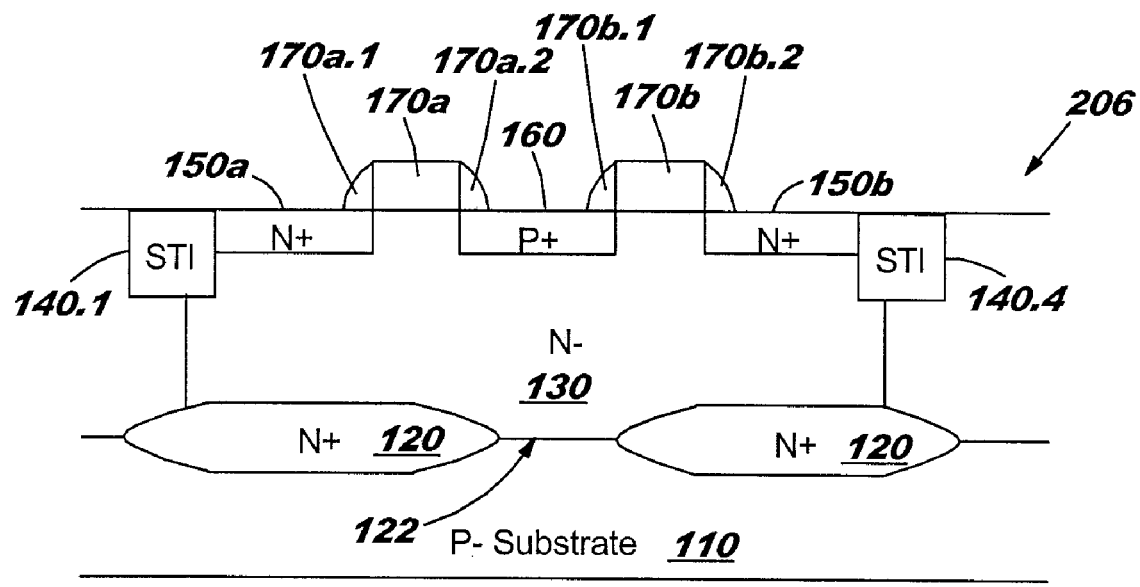

FIG. 2C illustrates a diode 206, which is yet another variation of the diode 100 of FIG. 1C, in accordance with embodiments of the present invention. Here, the STI 140.2 and 140.3 are omitted. Instead, polysilicon gate 170a with spacers 170a.1 and 170a.2 and polysilicon gate 170b with spacers 170b.1 and 170b.2 are formed using standard MOSFET processes. The gates 170a and 170b are used to define the N+ regions 150a and 150b, and the P+ region 160. The polysilicon gate structures 170 and spacer elements 170a, 170b are used to define the p+ and n+ implant edges and prevent salicide bridging from the p+ to n+ doped regions. The polysilicon gate structure 170 prevents salicide shorting as well as p+/n+abutment. The utilization of the polysilicon gate structure 170 provides another means of tunable capacitance of the junction edge of the anode structure 160, prevents STI-pulldown effects, and minimizes salicide sensitivities for ESD and analog applications. This novel structure can be used for RF applications to provide good C(V) and dC(V)/dV characteristics. As in prior discussion, the masked implant can be an n-well, or a sub-collector (e.g. either epitaxial formed or implanted). In one embodiment, deep trenches (not shown, but analogous to the deep trenches 165a and 165b of FIG. 2B) can be formed in the diode 206 so as to electrically isolate the diode 206 from adjacent devices in the substrate 110, and to lower the diode capacitance. Adding the DT structure electrically isolates and improves the latchup robustness of the technology.

Figure 2D:
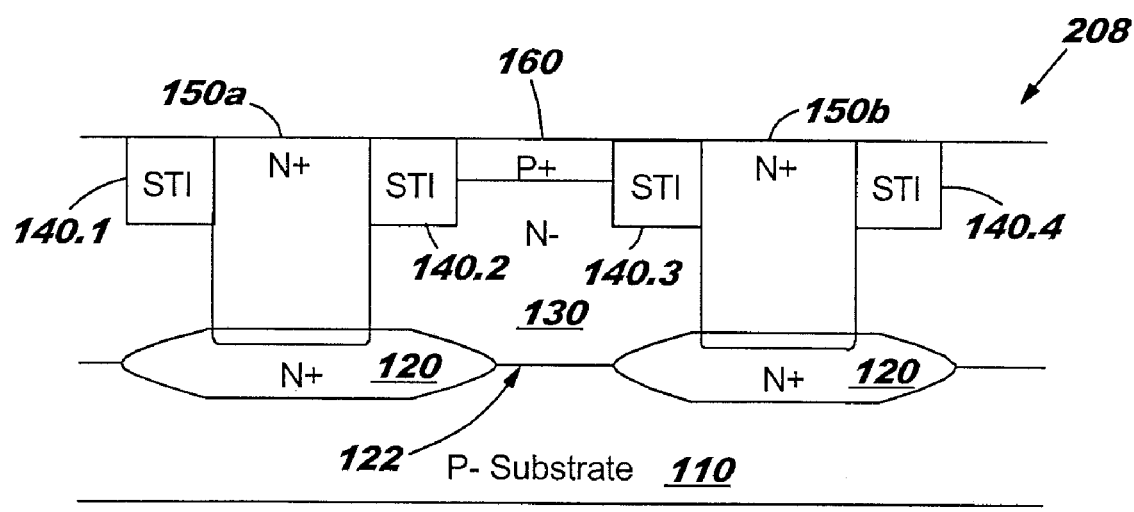

FIG. 2D illustrates a diode 208, which is yet another variation of the diode 100 of FIG. 1C, in accordance with embodiments of the present invention. Here, the N+ regions 150a and 150b extend down and come into direct physical contact with N+ regions 120. As a result, the PN junction of the diode 208 comprises P+ region 160 for the P side and the regions 150a, 150b, 120, and 130 for the N side. Again, the size of the opening 122 affects the capacitance and the breakdown voltage of the diode 208. In this case, reach-through or sinker implants can be utilized to connect to the lower region and modulate the C(V) characteristics.

Figure 3:
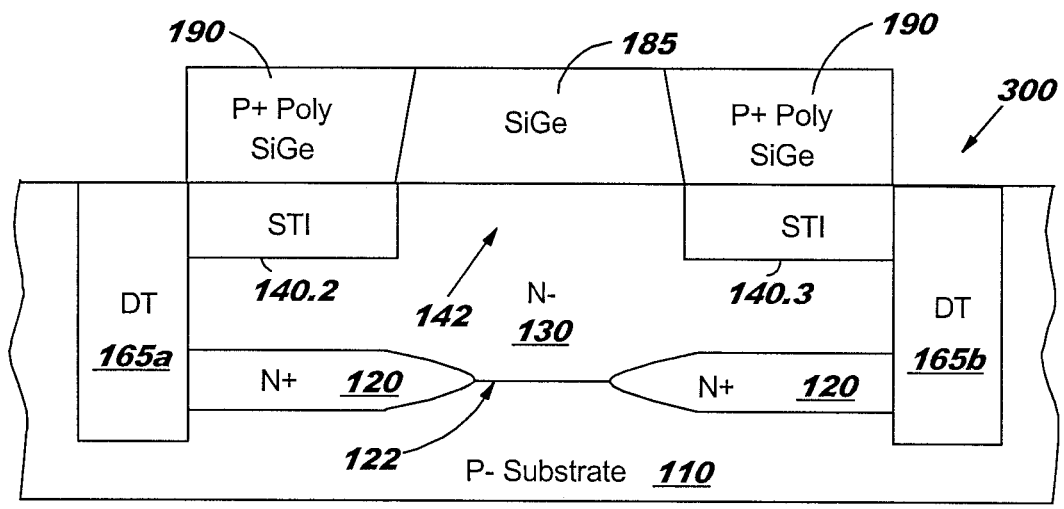
FIG. 3 illustrates a variation of the diode of FIG. 2B, in accordance with embodiments of the present invention.

FIG. 3 illustrates a diode 300, which is a variation of the diode 204 of FIG. 2B, in accordance with embodiments of the present invention. This structure 300 is suitable to be formed in a Silicon Germanium technology. In the case of a non-implanted sub-collector, the wafer is formed, followed by the masked sub-collector definition, followed by epitaxial growth and then deep trench structures. In an implanted sub-collector, this is formed after the deep trench formation. Here, more specifically, after the deep trenches 165a and 165b, the N+ region 120 with the opening 122, and the N− region 130 are formed in that order, the two STI regions 140.2 and 140.3 are formed. After formation of the MOSFET process steps, a Silicon Germanium base region 185 is defined for the SiGe hetero-junction bipolar transistor element. More specifically, single thin film 185 made of SiGe (silicon germanium) is formed on top of the opening 142 using, inter alia, UHV/CVD (Ultra High Vacuum Chemical Deposition) process. This single film 185 forms single crystal SiGe over the Si region, and forms a poly-SiGe film 190 over the isolation structures 140. In one embodiment, the thickness of the single film 185 is thicker over the STI where the two films have crystal cleavage transition plane starting at the STI-Si—SiGe triple point. As a result, the polysilicon germanium/silicon germanium film 190,180 serves as the anode of the diode 300 and the N+ region 120 can serve as a cathode of the diode 300. In one embodiment, the N+ region 120 can be electrically coupled to an exterior of the diode 300 by forming a trough (not shown) extending from the surface of the substrate 110 down to the N+ region 120 and filling the trough with conducting materials.

Figure 4:
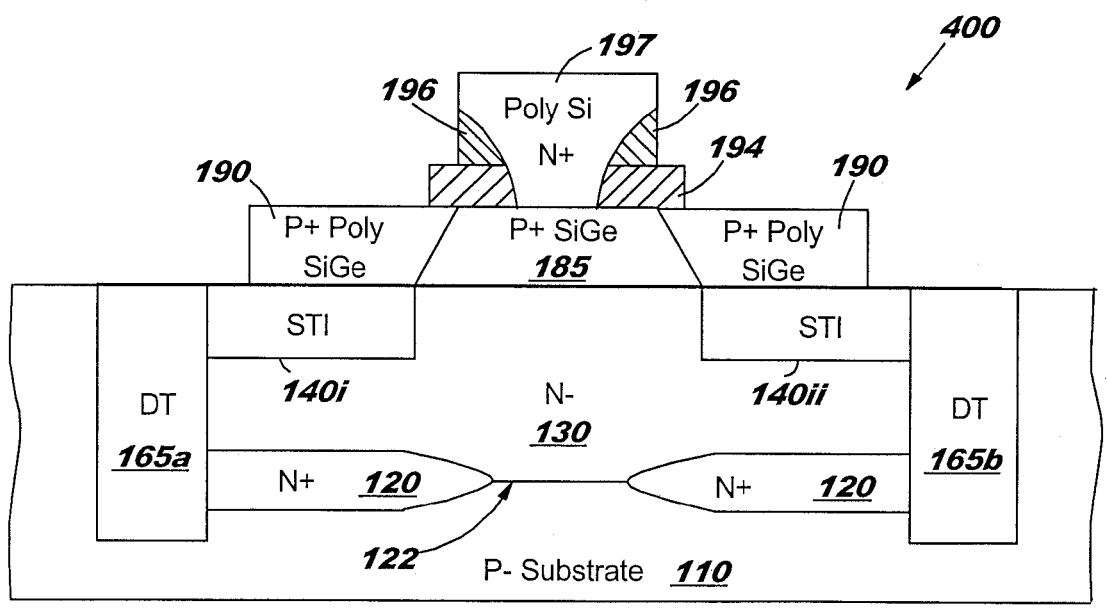
FIG. 4 illustrates a variation of the diode of FIG. 3, in accordance with embodiments of the present invention.

FIG. 4 illustrates a diode 400, which is a variation of the diode 300 of FIG. 3, in accordance with embodiments of the present invention. Here, upon the p-type SiGe film 185, a dielectric film 194 and spacer 196 are formed using standard processes. Then, a poly-silicon n+ doped emitter 197 of opposite doping concentration is formed in direct physical contact with the SiGe single crystal p− doped film 185. As a result, the emitter 197 can serve as a parallel diode cathode of the diode 400 and the N+ region 120 can serve as a second cathode of the diode 400. In one embodiment, the N+ region 120 can be electrically coupled to an exterior of the diode 400 by forming a trough (not shown) extending from the surface of the substrate 110 down to the N+ region 120 and filling the trough with conducting materials. In this embodiment, the inventive sub-collector region opening 122 is chosen to provide the most optimum C(V) value, dC/dV value and desired breakdown voltage and injection characteristics.

Figure 5:
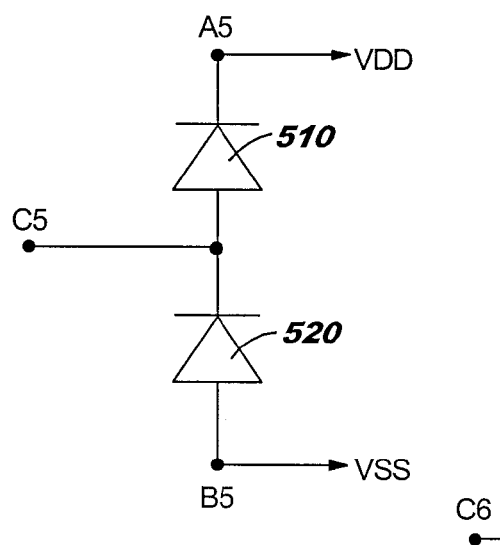
FIGS. 5, 6, 7, and 8 illustrate different configurations for using diodes, in accordance with embodiments of the present invention.

FIGS. 5, 6, 7, and 8 illustrate different configurations for using the diodes described above, in accordance with embodiments of the present invention. In FIG. 5, the anode and cathode of the diode 510 are electrically coupled to nodes C5 and A5, respectively. The anode and cathode of the diode 520 are electrically coupled to nodes B5 and C5, respectively. Node A5 can be connected to a voltage VDD, and node B5 can be connected to a voltage VSS (VSS<VDD).

When the voltage at node C5 is between VDD and VSS, there is no current flowing through either of the diodes 510 and 520. When voltage at node C5 exceeds VDD, the diode 510 is forward-biased. When voltage at node C5 exceeds VDD by a certain voltage difference equal to or greater than the forward bias value of the diode 510, the diode 510 is in forward bias mode and a current flows from node C5 to node A5 through the diode 510.

Similarly, when voltage at node C5 goes below VSS, the diode 520 is forward-biased. When VSS exceeds the voltage at node B5 by a certain voltage difference equal to or greater than the forward bias voltage of the diode 520, the diode 520 is in forward mode and current flows from node B5 to node C5 through the diode 520. As a result, if an electric node of a circuit (not shown) is electrically connected to node C5, and if for some reason, the voltage at node C5 swings outside the range of VSS-VDD by a margin exceeding the forward bias voltages of the diodes 510 and 520, currents will flow through the diodes 510 and 520, preventing damage to the circuit. As the voltage swings through the condition between VDD and VSS, one element is in a forward bias state and the other element is in a reverse bias state. In this condition, the values of the C(V) dependence are different conditions.

It is the motivation of the inventor to have the sum of the total capacitance linearized so that the voltage dependence of the first diode 510 is compensated by the second diode 520. This provides improved linearity. Since the diode elements 510 and 520 may not be identical in size, an optimization may be achieved where the various variables come into play to provide the optimum ESD protection, the optimum C(V) dependence, the optimum dC/dV dependence and other RF characteristics. Hence utilizing a design system which allows for personalization and customization of the ESD, C(V) dependence, dC/dV, and other RF parametrics are desired. This is achievable using a design system with graphical unit interface (GUI) which defines the variables of interest for optimization, and using parameterized cells (Pcells) for the diode elements. In this design system, the tuning is achieved using the C(V) and dC/dV, and breakdown characteristics of the element to provide the optimum design conditions. The GUI allows the designer to change the mask opening to modify the C(V) characteristics and magnitudes by allowing parallel elements to exist. The parallelism allows for a plurality of different mask openings in either identical elements, or different diode elements. This is also achievable using a multi-finger structure where the mask opening is non-identical, and the fingers are of different widths and lengths. This allows design optimization variables of number of fingers, width, length, and sub-collector mask opening to provide the optimum ESD, latchup and RF characteristics.

Figure 6:
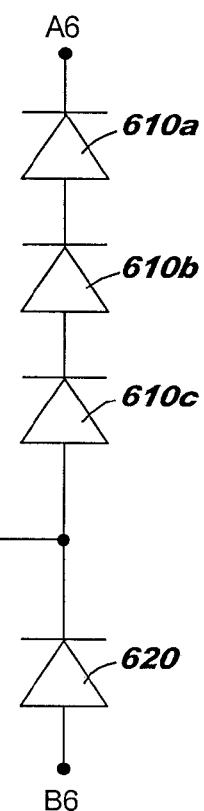

In FIG. 6, the configuration is similar to that of FIG. 5, except that three diodes 610a, 610b, and 610c are used in series in place of diode 510. As a result, if the diodes 610a, 610b, and 610c have capacitance dependence (C(V), dC/dV), and breakdown voltages for the values of V1, V2, and V3. Current is allowed to flow from C6 to A6 via the diodes 610a, 610b, and 610c only when the voltage at node C6 exceeds voltage at node A6 by V1+V2+V3. In this case, the desired C(V), and breakdown voltages are achievable by the number of diodes in series. Hence utilizing a design system which allows for personalization and customization of the ESD, C(V) dependence, dC/dV, and other RF parametrics are desired. This is achievable using a design system with graphical unit interface (GUI) which define the variables of interest for optimization, and using parameterized cells (Pcells) for the diode elements. In this design system, the tuning is achieved using the C(V) and dC/dV, and breakdown characteristics of the element to provide the optimum design conditions. The GUI allows for the designer to change the mask opening to modify the C(V) characteristics and magnitudes by allowing parallel elements to exist. The series configuration allows for a plurality of different mask openings in either identical elements, or different diode elements. This is also achievable using a multi-finger structure where the mask opening is non-identical, and the fingers are of different widths and lengths. This allows design optimization variables of number of fingers, width, length, and sub-collector mask opening and number of diodes in series to provide the optimum ESD, latchup and RF characteristics.

Figure 7:
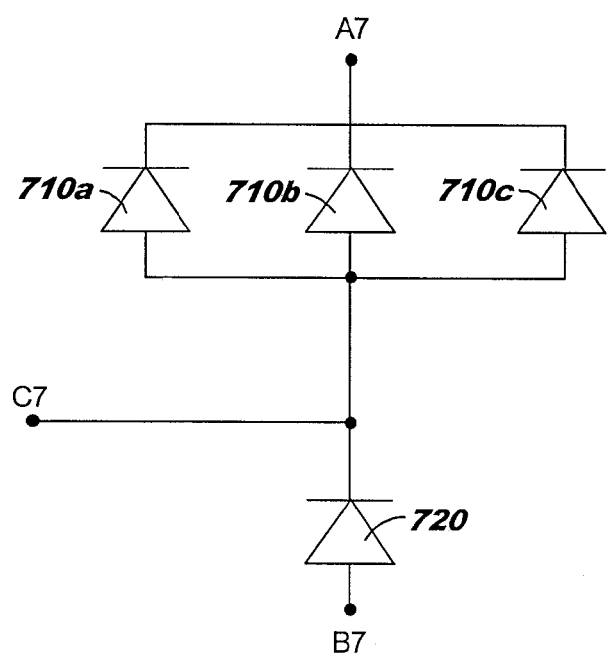

In FIG. 7, the configuration is similar to that of FIG. 5, except that three diodes 710a, 710b, and 710c are used in parallel in place of diode 510. As a result, the optimization can be achieved using both parallel and series configuration. Hence utilizing a design system which allows for personalization and customization of the ESD, C(V) dependence, dC/dV, and other RF parametrics are desired. This is achievable using a design system with graphical unit interface (GUI) which define the variables of interest for optimization, and using parameterized cells (Pcells) for the diode elements. In this design system, the tuning is achieved using the C(V) and dC/dV, and breakdown characteristics of the element to provide the optimum design conditions. The GUI allow for the designer to change the mask opening to modify the C(V) characteristics and magnitudes by allowing parallel and series elements to exist. The series configuration and parallel configuration allows for a plurality of different mask openings in either identical elements, or different diode elements. This is also achievable using a multi-finger structure where the mask opening is non-identical, and the fingers are of different widths and lengths. This allows design optimization variables of number of fingers, width, length, and sub-collector mask opening and number of diodes in series to provide the optimum ESD, latchup and RF characteristics.

Figure 8:
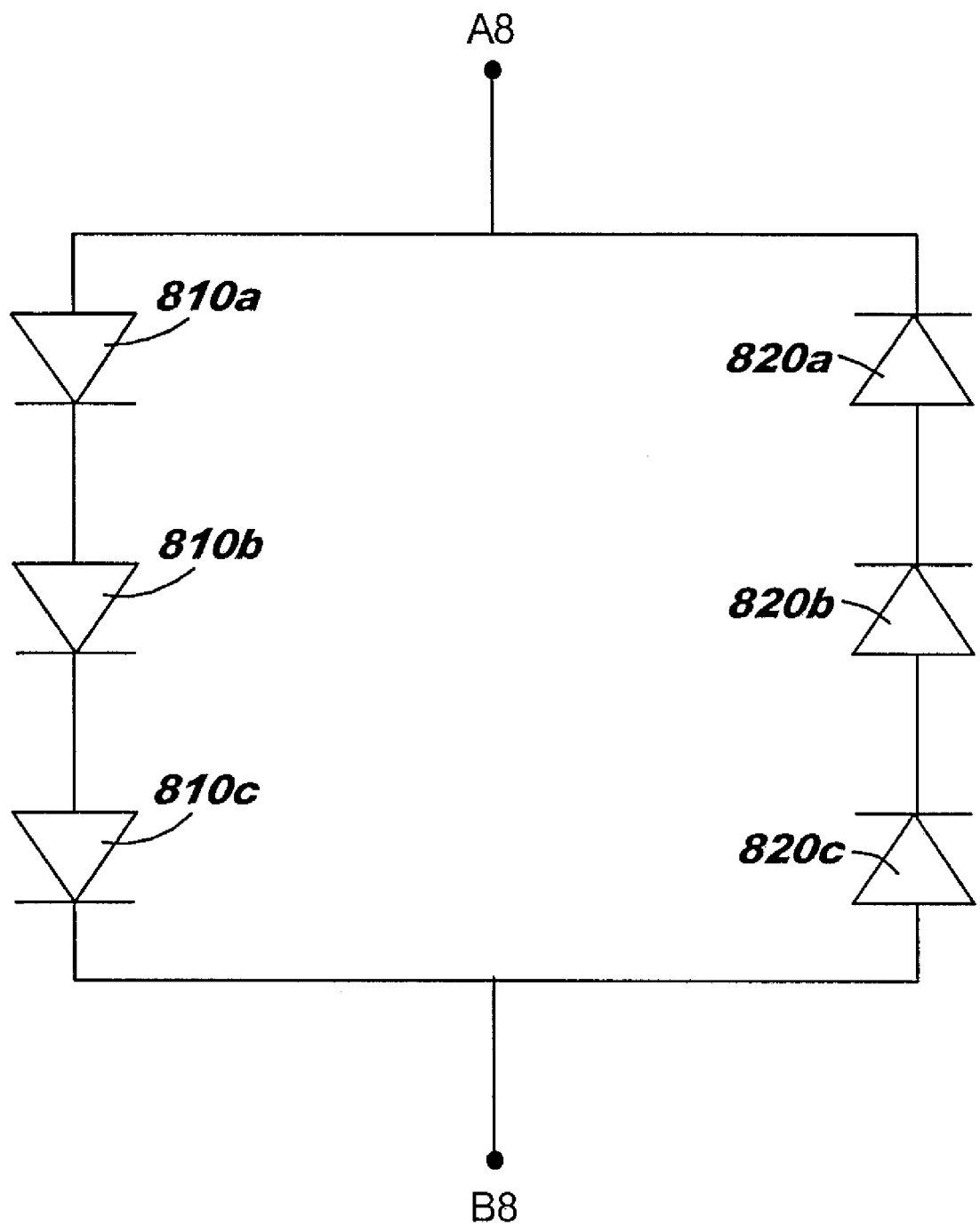

In FIG. 8, three diodes 810a, 810b, and 810c are electrically coupled in series between nodes A8 and B8. Three diodes 820a, 820b, and 820c are also electrically coupled in series between nodes A8 and B8. Assume that the breakdown voltages of the diodes 810a, 810b, 810c, 820a, 820b, and 820c are V1a, V1b, V1c, V2a, V2b, and V2c, respectively.

If $V_{A8}$-$V_{B8}$ exceeds $V_{1a}$+$V_{1b}$+$V_{1c}$ ($V_{A8}$ and $V_{B8}$ are voltages at nodes A8 and B8, respectively), then a breakdown current flows from A8 to B8 via three diodes 810a, 810b, and 810c. If $V_{B8}$-$V_{A8}$ exceeds $V_{2a}$+$V_{2b}$+$V_{2c}$, then a breakdown current flows from B8 to A8 via three diodes 820a, 820b, and 820c. In this back-to-back configuration, one diode string is always forward biased and the second is reversed biased. In this environment, the total capacitance coupling between the nodes A8 and B8 is addressable by the parallel and series design. This is achievable using a design system with graphical unit interface (GUI) which define the variables of interest for optimization, and using parameterized cells (Pcells) for the diode elements. In this design system, the tuning is achieved using the C(V) and dC/dV, and breakdown characteristics of the element to provide the optimum design conditions. The GUI allow for the designer to change the mask opening to modify the C(V) characteristics and magnitudes by allowing parallel and series elements to exist. The series configuration and parallel configuration allows for a plurality of different mask openings in either identical elements, or different diode elements. This is also achievable using a multi-finger structure where the mask opening is non-identical, and the fingers are of different widths and lengths. This allows design optimization variables of number of fingers, width, length, and sub-collector mask opening and number of diodes in series to provide the optimum ESD, latchup and RF characteristics.

In one embodiment, node A8 and node B8 can be electrically connected to any two electric nodes in the IC. For instance, A8 and B8 can be electrically connected to two grounds, to two power supply voltages, or to VDD and VSS.

In summary, by providing different sizes of the diodes and different sizes of the opening 122 in the diodes, the capacitance, loading effect, linearity characteristics, ESD levels of protection and breakdown voltages of the diodes can be tuned to the desired values during design phase and manufacturing. As a result, optimum ESD protection and noise coupling reduction can be achieved. Also, by using different configurations (parallel and/or series) as shown in FIGS. 5-8, a desired C-V (capacitance-voltage) characteristic for the structure can be achieved.

In the embodiments described above, the substrate 110 is doped with positive charge polarity (i.e., positive holes, hence P type semiconductor substrate). Alternatively, the substrate 110 can be doped with negative charge polarity (i.e., electrons). If so, the substrate 110 is of N type. Accordingly, the region 120 must be doped with positive charge polarity (P type). The region 130 must be also doped with positive charge polarity, but with lighter doping concentration (i.e., P−).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor fabrication method, comprising:
   providing a semiconductor diode structure, wherein the semiconductor diode structure comprises:
   (a) a substrate layer comprising a semiconductor material and first dopants of a first doping polarity,
   (b) a first layer having an opening, the first layer being on top of and in direct physical contact with the substrate layer, the first layer consisting of only one piece of continuously distributed semiconductor material and second dopants of a second doping polarity, the second doping polarity being opposite to the first doping polarity, and
   (c) a second layer being on top of and in direct physical contact with the first layer, the second layer comprising the semiconductor material and third dopants of the second doping polarity, the first layer having a higher doping concentration than the second layer, wherein the second layer is in direct physical contact with the substrate layer through the opening of the first layer; and
   forming an electrode structure being on top of and in direct physical contact with the second layer, the electrode structure including at least an anode and a cathode, wherein both the anode and the cathode are (i) in direct physical contact with the second layer and (ii) not in direct physical contact with the first layer.

2. The method of claim 1, wherein said providing the semiconductor diode structure comprises:
   providing a semiconductor layer; then
   implanting the second dopants in the semiconductor layer resulting in the first layer with the opening; then
   implanting the third dopants in the semiconductor layer resulting in the second layer.

3. The method of claim 1, wherein said providing the semiconductor diode structure comprises:
   providing a semiconductor layer; then
   implanting the second dopants in the semiconductor layer resulting in the first layer with the opening; then
   epitaxially growing the second layer on top of and from the first layer.

4. The method of claim 3; wherein said providing the semiconductor diode structure further comprises, after said epitaxially growing, implanting dopants of the second doping polarity in the second layer.

5. The method of claim 1, further comprising, after said forming the electrode structure, extending the cathode down in direct physical contact with the first layer.

6. The method of claim 1,
   wherein the anode comprises dopants of the first doping polarity, and
   wherein the cathode comprises dopants of the second doping polarity.

7. The method of claim 1, wherein said providing the semiconductor structure comprises:
   choosing a desired breakdown voltage for the semiconductor diode structure;
   determining a size of the opening so as to achieve the desired breakdown voltage; and
   forming the first layer having the opening with the determined size.

8. The method of claim 1, wherein the semiconductor diode structure further comprises at least one STI (Shallow Trench Isolation) region disposed between the anode and the cathode.

9. The method of claim 1, wherein the semiconductor diode structure further comprises plurality of deep trenches physically surrounding and electrically isolating the semiconductor diode structure.

10. The method of claim 1, further comprising, after said providing the semiconductor diode structure, changing size and shape of the first layer resulting the opening disappearing.

11. The method of claim 1,
wherein the first dopants are of P-type, and wherein the second and third dopants are of N-type.

\* \* \* \* \*